United States Patent [19]

Moench et al.

[11] Patent Number: 4,490,627
[45] Date of Patent: Dec. 25, 1984

[54] SCHMITT TRIGGER CIRCUIT

[75] Inventors: Jerry D. Moench; Frank A. Miller, both of Austin, Tex.

[73] Assignee: Motorola, Inc., Schaumburg, Ill.

[21] Appl. No.: 442,485

[22] Filed: Nov. 17, 1982

[51] Int. Cl.³ .......................................... H03K 3/295
[52] U.S. Cl. .................................... 307/290; 307/359
[58] Field of Search ............... 307/279, 290, 304, 359, 307/475

[56] References Cited

U.S. PATENT DOCUMENTS

| | | | |
|---|---|---|---|
| 3,882,331 | 5/1975 | Sasaki | 307/279 |
| 4,069,431 | 1/1978 | Kucharewski | 307/290 |
| 4,376,251 | 3/1983 | Kobayashi et al. | 307/290 |
| 4,379,974 | 4/1983 | Plachno | 307/290 |

Primary Examiner—John Zazworsky
Attorney, Agent, or Firm—James L. Clingan, Jr.

[57] ABSTRACT

A Schmitt trigger uses a switched high gain MOS transistor coupled to a control node for speed but a low gain transistor to establish a control voltage on the control node to minimize current flow. In one mode the high gain transistor is switched off to allow the control node to increase in voltage. The low gain transistor limits the voltage on the control node by drawing current therefrom. Such current drawing is delayed in time to avoid reducing the initial rate of increase in voltage on the control node. By limiting the voltage on the control node, the charge stored is reduced thereby reducing effective input capacitance. Additionally, speed is increased when the high gain transistor is turned on because the voltage on the control node does not have to be reduced as far.

6 Claims, 1 Drawing Figure

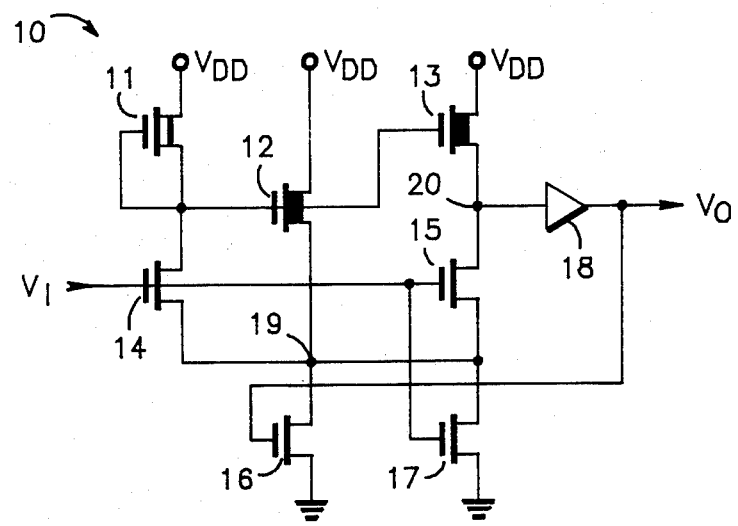

SCHMITT TRIGGER CIRCUIT

BACKGROUND OF THE INVENTION

This invention relates to Schmitt trigger circuits, and more particularly to MOS Schmitt trigger circuits.

A Schmitt trigger in MOS technology typically provides hysteresis by varying the voltage on the source of an input transistor. A control transistor is coupled between the source of the input transistor and ground to control the hysteresis. The control transistor causes the source of the input transistor to be at essentially ground potential when a logic high is received by the input transistor. Alternatively, when a logic low is received, the control transistor allows a control voltage to build up on the source of the input transistor. Because in a typical MOS Schmitt trigger the control transistor is in series with the output, it has been found to be desirable for the control transistor to be of relatively high gain so as to provide a relatively high current carrying capability. Even if the output is to sink a relatively small d.c. current, for speed purposes it is still desirable to have relatively large current carrying capability so as to be able to quickly discharge the capacitance on the output. With the control transistor being of relatively high gain, a relatively high current is required to build up the control voltage. Consequently it has been found to be desirable to turn the control transistor off when the input is a logic low, which is the case when the control voltage is to be developed.

Although current consumption is reduced by turning off the control transistor, control of the control voltage is diminished. The control voltage becomes too high for optimum speed as well as causing an increase in effective input capacitance. With a larger differential between the input voltage level and the control voltage, more charge is stored causing the increase in effective input capacitance. Also with a higher control voltage speed is reduced because the time required to reduce the voltage on the source of the input transistor is increased. U.S. Pat. No. 4,063,119 Odell et al and U.S. Pat. No. 4,071,784 Maeder et al both show a Schmitt trigger with a control transistor (transistor T3 and transistor 19, respectively) which is not switched off when a logic low input is received. Consequently, in such a case, a trade off is required between optimizing speed with a relatively large control transistor and minimizing current flow with a relatively small control transistor.

SUMMARY OF THE INVENTION

An object of the instant invention is to provide an improved Schmitt trigger circuit.

Another object of the invention is to provide a Schmitt trigger with reduced input capacitance and increased speed while maintaining low current flow.

Yet another object is to provide a Schmitt trigger circuit with a switched control transistor and an optimized control voltage.

These and other objects of the invention are achieved by providing a Schmitt trigger circuit with an input transistor having a control electrode for receiving an input signal, a first current electrode coupled to a control node, and a second current electrode. A load device is coupled between a first power supply terminal and the second current electrode of the input transistor. Voltage coupling means couples a voltage to the control node. Voltage limiting means limits the voltage level supplied at the control node when the input signal is in a first logic state. Grounding means couples the control node to a second power supply terminal when the input signal is in a second logic state.

BRIEF DESCRIPTION OF THE DRAWING

Shown in the single FIGURE is a circuit diagram of a Schmitt trigger circuit according to a preferred embodiment of the invention.

DESCRIPTION OF A PREFERRED EMBODIMENT

Shown in the single FIGURE is a Schmitt trigger circuit 10 made of N channel insulated gate field effect transistors manufactured in what is commonly known as MOS technology. Circuit 10 comprises a depletion transistor 11 having a threshold voltage between −2.5 and −3.5 volts, natural transistors 12 and 13 having a threshold voltage of between 0.1 and 0.3 volt, enhancement transistors 14, 15, 16, and 17 having a threshold voltage of between 0.6 and 1.0 volts, and a non-inverting amplifier 18. Transistor 11 has a drain connected to a positive power supply terminal $V_{DD}$ for receiving a positive power supply voltage, for example 5.0 volts, and a gate and a source connected together. Transistor 12 has a gate connected to the source and gate of transistor 11, a drain connected to $V_{DD}$, and a source connected to a control node 19. Transistor 13 has a gate connected to the source and gate of transistor 11, a drain connected to $V_{DD}$, and a source connected to a node 20. Transistor 14 has a gate for receiving an input signal $V_I$, a drain connected to the source and gate of transistor 11, and a source connected to node 19. Transistor 16 has a drain connected to node 19, a source connected to a negative power supply terminal for receiving current shown as ground, and a gate. Transistor 17 has a gate for receiving input signal $V_I$, a drain connected to node 19, and a source connected to ground. Amplifier 18 has an input connected to node 20, and an output, for providing output signal $V_O$, which is also connected to the gate of transistor 16. Amplifier 18 is constructed by conventional means to provide the same logic state on the output as received on the input. In addition to providing amplification, amplifier 18 also provides a time delay.

When signal $V_I$ is at a logic high which may be as low as 2.4 volts, transistor 17 is turned on sufficiently hard to pull node 19 to essentially ground potential. With node 19 at ground potential, transistors 14 and 15 are turned on to bring their respective drains also to essentially ground potential. Consequently transistors 12 and 13 are turned off and amplifier 18 provides signal $V_O$ at a logic low which in turn ensures that transistor 16 is off. Transistor 11 acting as a load device does conduct some current but is chosen to be of relatively low gain so that the current is relatively small.

When signal $V_I$ is a logic low, transistor 14, 15 and 17 are turned off. The voltage at $V_{DD}$ is then coupled to the gates of transistors 12 and 13 via transistor 11. Transistor 13, because it is a natural transistor with a low threshold voltage, drops very little voltage between $V_{DD}$ and node 20. Amplifier 18 responds by providing signal $V_O$ at a logic high which causes transistor 16 to turn on. Because transistor 12 is also on, there is a current path between $V_{DD}$ and ground through transistors 12 and 16. The gains of transistors 12 and 16 are selected to obtain the desired control voltage, for example 1.2 volts, on control node 19. The technique of selecting gains of transistors for obtaining a gain ratio which gives a desired voltage division is well understood in the art. The logic low level for TTL compatibility may be as high as 0.8 volt. For the worst case condition in which enhancement transistors 14-17 have a threshold voltage of 0.6 volt, transistor 17 will be slightly conductive for the 0.8 volt logic low level. Although transistor 17 has a relatively high gain, so do transistors 15 and 13. Consequently, node 20 will remain at a sufficiently high voltage to avoid effecting signal $V_O$. Performance in terms of speed and current flow is somewhat diminished but circuit 10 will still be functional. A typical use for circuit 10 is in a high density memory in which case memories are frequently tested to various levels of performance. Even though optimum performance is obtained when the enhancement threshold voltages exceed 0.8 volt, there is still a market for lower performance but still functional parts. Given for example, are channel length ratios of transistors 12, 13, 14, 15, 16 and 17 of 6/3, 80/2.5, 150/2, 200/2, 8/3 and 400/2, respectively.

One of the reasons for using a Schmitt trigger is to obtain a signal with very fast rise and fall times even when there is substantial variation in the rise and fall time of an input signal. For the logic high to logic low transition, transistor 16 is used to advantage to reduce the voltage on node 19. As stated previously, in the past a transistor analogous to transistor 12 would charge control node 19 to 4.0 volts typically because it was found desirable to turn high gain transistor 17 off when signal $V_I$ was a logic low. With node 19 now at a lower voltage, chosen to be 1.2 volts, an effective input capacitance which provides a loading effect to signal $V_I$ is reduced and speed is increased. Transistor 15 has a gate to source capacitance charged to 1.2 volts whereas it was previously charged to 4.0 volts. Transistor 17 has a gate to drain capacitance charged to 1.2 volts which was previously also charged to 4.0 volts. Consequently, there was more than three times as much charge stored on these two capacitances prior to the use of transistor 16 as there is with transistor 16. The same is true for a gate to source capacitance of transistor 14 which is in parallel with the gate to source capacitance of transistor 15. Consequently the capacitive loading of signal $V_I$ is reduced for the logic low to logic high transition. Speed is also improved because transistors 14 and 15 will turn on sooner. Transistors 14 and 15 cannot turn on until node 19 is at least an enhancement threshold voltage below the voltage level of signal $V_I$. As signal $V_I$ begins rising from a logic low, transistor 17 turns on to begin reducing the voltage level on node 19. Because the voltage level on node 19 is at 1.2 volts instead of 4.0 volts, an enhancement threshold differential between signal $V_I$ and node 19 will be reached sooner.

For the logic high to logic low transition node 19 increases in voltage to increase the speed. As signal $V_I$ begins to drop in voltage transistor 14 will become less conductive causing transistor 12 to begin turning on. Transistor 12 is advantageously chosen to be a natural transistor so that it will turn on sooner than would an enhancement transistor. Transistor 17 also becomes less conductive causing a rise in voltage on node 19 which increases the speed at which transistors 14 and 15 become less conductive. Node 20 reaches a sufficiently high voltage to cause signal $V_O$ to switch from a logic low to a logic high which causes transistor 16 to turn on. Due to the time delay of amplifier 18, transistor 16 does not turn on until the advantageous effects of the rise in voltage of node 19 have been achieved. Transistor 16 then limits the voltage on node 19 to that selected by selecting the ratio of the gains of transistors 12 and 16.

In order to achieve the advantages of having a reduced voltage on node 19 for the logic low to logic high transitions of signal $V_I$ other possibilities exist. The gate of transistor 16 could be connected to $V_{DD}$ to achieve the desired voltage division. In such a case, however, transistor 16 would be conducting current during the logic low to logic high transition which would disadvantageously cause the voltage on node 19 to rise more slowly. Another alternative would be to connect the gate of transistor 16 to node 20 which would be an improvement over having the gate connected to $V_{DD}$ because node 19 would have risen some in voltage before transistor 16 would turn on. The additional delay of amplifier 18, however, provides an opportunity for node 19 to rise in voltage unimpeded for a longer time. One or more diode-connected transistors between node 19 and ground could also be used to limit the voltage on node 19. If the threshold voltage of these diode-connected transistors could be sufficiently controlled and if the desired voltage on node 19 was a whole number multiple of such threshold voltage, this would be a good solution. Such is not likely to be the case.

The use of transistor 16 as shown in the FIGURE provides for substantial flexibility in choosing the desired voltage for node 19. The performance is improved for the logic low to logic high transition without causing an adverse effect on the logic high to logic low transition.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:
1. A Schmitt trigger circuit, comprising:
an input transistor having a control electrode for receiving an input signal, a first current electrode coupled to a control node, and a second current electrode;
a first load device coupled between a first power supply terminal and the second current electrode of the input transistor;
first coupling means for coupling a voltage to the control node;
voltage limiting means for limiting the voltage level at the control node when the input signal is in a first logic state; and
second coupling means for coupling the control node to a second power supply terminal when the input signal is in a second logic state.

2. The circuit of claim 1 further comprising:
an output transistor having a control electrode for receiving the input signal, a first current electrode coupled to the control node, and a second current electrode; and
a natural transistor having a control electrode coupled to the second current electrode of the input transistor, a first current electrode coupled to the first power supply terminal, and a second current electrode coupled to the second current electrode of the output transistor, wherein the natural transistor has a threshold voltage near zero volts.

3. The circuit of claim 2 further comprising an amplifier having an input coupled to the second current electrode of the output transistor and an output coupled to the voltage limiting means.

4. A Schmitt trigger circuit, comprising:
an input transistor having a control electrode for receiving an input signal, a first current electrode coupled to a control node, and a second current electrode;
a load device coupled between a first power supply terminal and the second current electrode of the input transistor;
first coupling means for coupling a voltage to the control node;
second coupling means for coupling the control node to a second power supply terminal only when the input signal is in a first logic state; and
voltage limiting means for limiting the voltage on the control node by providing a current path to the second power supply terminal in response to a delayed signal which is delayed in time from a transition of the input signal from the first logic state to a second logic state.

5. A Schmitt trigger circuit, comprising:
a first transistor having a control electrode for receiving an input signal, a first current electrode coupled to a control node, and a second current electrode;
a first load device coupled between a first power supply terminal and the second current electrode of the first transistor;
a second transistor having a control electrode coupled to the second current electrode of the first transistor, a first current electrode coupled to the first power supply terminal, and a second current electrode coupled to the control node;
a third transistor having a control electrode for receiving the input signal, a first current electrode coupled to the control node, and a second current electrode;
a fourth transistor having a control electrode for receiving the input signal, a first current electrode coupled to the control node, and a second current electrode coupled to a second power supply terminal;
a fifth transistor having a control electrode coupled to the second current electrode of the third transistor, a first current electrode coupled to the control node, and a second current electrode coupled to the second power supply terminal; and
a sixth transistor having a control electrode coupled to the second current electrode of the first transistor, a first current electrode coupled to the first power supply terminal, and a second current electrode coupled to the second current electrode of the third transistor.

6. The circuit of claim 5 further comprising an amplifier interposed between the second current electrode of the third transistor and the control electrode of the fifth transistor having an input coupled to the second current electrode of the third transistor and an output coupled to the control electrode of the fifth transistor.

* * * * *